United States Patent [19]

Woerner

[11] Patent Number: 4,894,506
[45] Date of Patent: Jan. 16, 1990

[54] METHOD AND APPARATUS FOR REFLOW SOLDERING OF ELECTRICAL COMPONENT LEADS, INCLUDING FLOATING HEATER BAR

[75] Inventor: Klaus D. Woerner, Cambridge, Canada

[73] Assignee: Automation Tooling Systems Inc., Kitchener, Canada

[21] Appl. No.: 246,796

[22] Filed: Sep. 20, 1988

[51] Int. Cl.$^4$ .............................................. B23K 1/12
[52] U.S. Cl. ............................... 219/85.22; 219/85.16; 219/85.18; 219/85.19
[58] Field of Search ............... 219/85.16, 85.18, 85.19, 219/85.22, 233, 228, 235; 228/180.2

[56] References Cited

U.S. PATENT DOCUMENTS

| | | |
|---|---|---|
| 1,928,522 | 9/1933 | Amondsen . |
| 3,230,338 | 1/1966 | Kawecki .......................... 219/85.16 |
| 3,906,186 | 9/1975 | Szolis . |
| 3,995,135 | 11/1976 | Osipov et al. . |
| 4,568,819 | 2/1986 | Stacconi . |
| 4,654,507 | 3/1987 | Hubbard et al. ................. 219/85.16 |
| 4,720,035 | 1/1988 | Isogai .............................. 219/85.16 |

Primary Examiner—Clifford C. Shaw
Attorney, Agent, or Firm—R. Craig Armstrong

[57] ABSTRACT

A method of reflow soldering a row of electrical component leads to a printed circuit board using a heater bar is disclosed. The method involves the steps of, firstly, moving the heater bar to a position above the location of the leads and allowing the heater bar to rock within its plane to float into proper position, and secondly, then clamping the heater bar, supplying voltage to heat the heating element portion of the heater bar, and applying soldering pressure. Corresponding apparatus is disclosed, in which the heater bar is adapted to rock within its plane. The heater bar has a support arm projecting upwardly from the heating element portion. A carriage includes a channel which accommodates the support arm and is somewhat larger in the horizontal dimension in the plane of the heater bar, thereby allowing the heater bar to rock. A clamping bar is movable into the channel for clamping the heater bar via the support arm. Voltage is supplied to the heating element though the contacts between positive and negative contact portions of the clamping bar and support arm respectively.

18 Claims, 3 Drawing Sheets

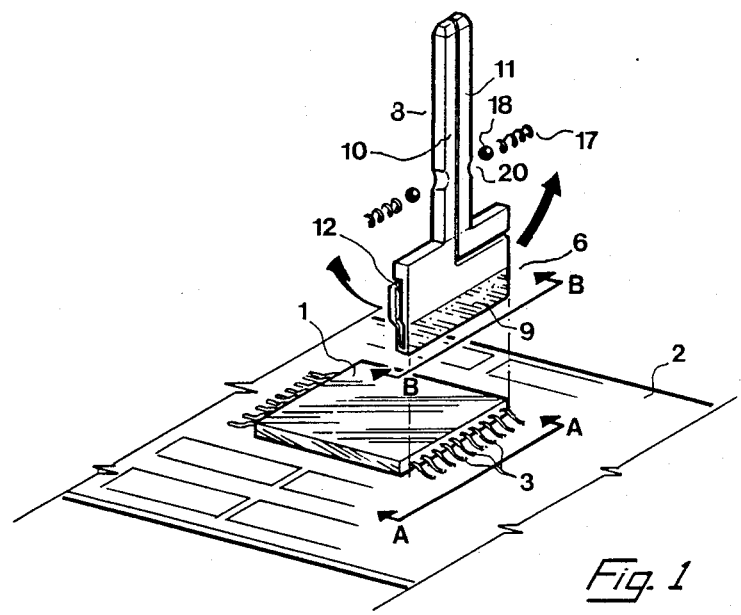
Fig. 1
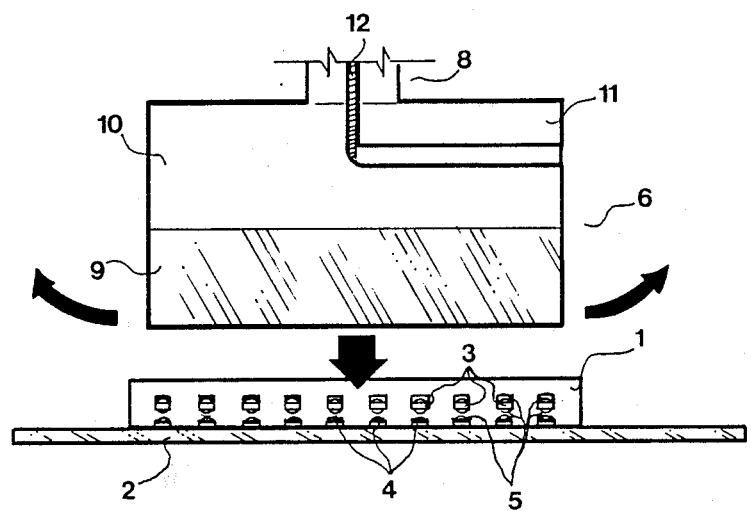
Fig. 2 A-A

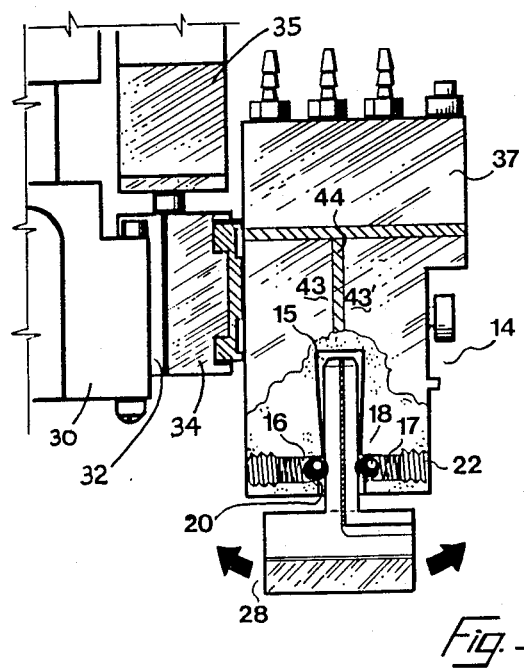
Fig. 3 B-B
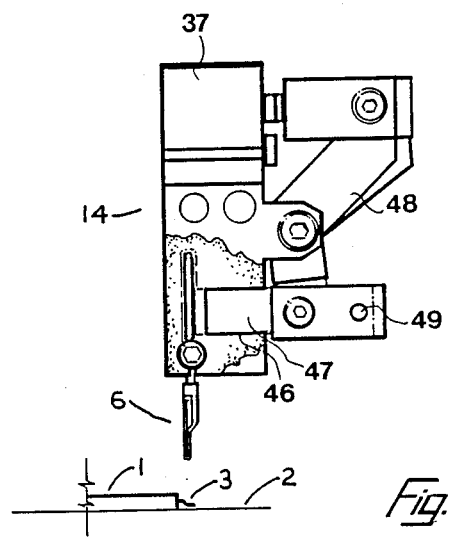
Fig. 4

METHOD AND APPARATUS FOR REFLOW SOLDERING OF ELECTRICAL COMPONENT LEADS, INCLUDING FLOATING HEATER BAR

BACKGROUND OF THE INVENTION

This invention relates to the soldering of electrical component leads to a printed circuit board, especially for surface mounting of electrical components.

In surface mount technology, electrical components are installed on the surface of a circuit board with the leads bonded to the surface, instead of the conventional method of having the leads pass through holes in the circuit board. One method of bonding the leads is reflow soldering, i.e. applying heat to leads which already have the correct amount of solder and thereby causing the solder to "reflow" and effect the soldered bond. To accomplish this, it is known to position the component on the board and then apply heat to solder the leads, the heat being applied by a heater bar which solders all of the leads along one side of the component simultaneously. There may be several heater bars acting simultaneously, to solder the leads projecting from other sides of the component. This can be done in an automated fashion, with the component being positioned by a robot, a pneumatic cylinder or cylinders moving the heater bar(s) downward onto the leads, and a voltage then being applied to generate the heat and solder the leads.

Conventionally, the heater bar is rigidly mounted, so that it moves straight up and down with the bar remaining horizontal. Thus if there is any angle at all on the leads, due either to the circuit board not being perfectly horizontal, or the component not sitting perfectly flat on the circuit board, or some combination, the result is that the leads opposite one end of the heater bar may not be contacted and soldered properly, while the leads opposite the other end may be damaged due to too much pressure being exerted.

The present invention responds to the need to avoid uneven pressure on the component leads during the reflow soldering.

SUMMARY OF THE INVENTION

It is an object of the invention to provide an improved method of reflow soldering rows of electrical component leads to a printed circuit board using a heater bar, and to provide apparatus for carrying out the method.

In the method of the present invention, the heater bar is moved to a position above the location of the leads and is allowed to rock within its plane to float into proper position. The heater bar is then clamped, voltage is supplied to heat the heating element portion of the heater bar, and soldering pressure is applied.

In accordance with the apparatus of the invention there is provided a heater bar positionable above the leads and means for moving the heater bar to contact the leads and press them against the printed circuit board. The invention resides in the heater bar being adapted to rock within its plane. Preferably, the apparatus also includes means for clamping the heater bar to arrest rocking.

The heater bar preferably has a support arm projecting therefrom in the direction upwardly away from the heating element portion. A carriage is movably mounted on a frame, and the carriage includes a channel which accommodates the support arm and is somewhat larger in the horizontal dimension in the plane of the heater bar, thereby allowing the heater bar to rock. Means are provided for loosely retaining the support arm in the channel.

The clamping means in the preferred embodiment preferably includes a clamping bar moving into the channel in a direction generally normal to the plane of the heater bar. Preferably, the support arm includes positive and negative contact portions insulated from each other and the clamping bar includes corresponding positive and negative contact portions insulated from each other, such that the clamping results in a voltage being supplying across the heating element portion of the heater bar.

Further features and details of the invention will be described or will become apparent during the following detailed description of the preferred embodiment.

BRIEF DESCRIPTION OF THE DRAWINGS

In order that the invention may be more clearly understood, the preferred embodiment thereof will now be described in detail by way of example, with reference to the accompanying drawings, in which:

FIG. 1 is a perspective showing the heater bar, circuit board and component, illustrating the principle of the invention;

FIG. 2 is a cross-section at A—A in FIG. 1, further illustrating the principle of the invention;

FIG. 3 a cross-section at B—B in FIG. 1, corresponding to FIG. 2 but showing the apparatus of the preferred embodiment;

FIG. 4 is a side elevation view of the apparatus;

DETAILED DESCRIPTION OF THE PREFERRED EMBODIMENT

Figure 5:
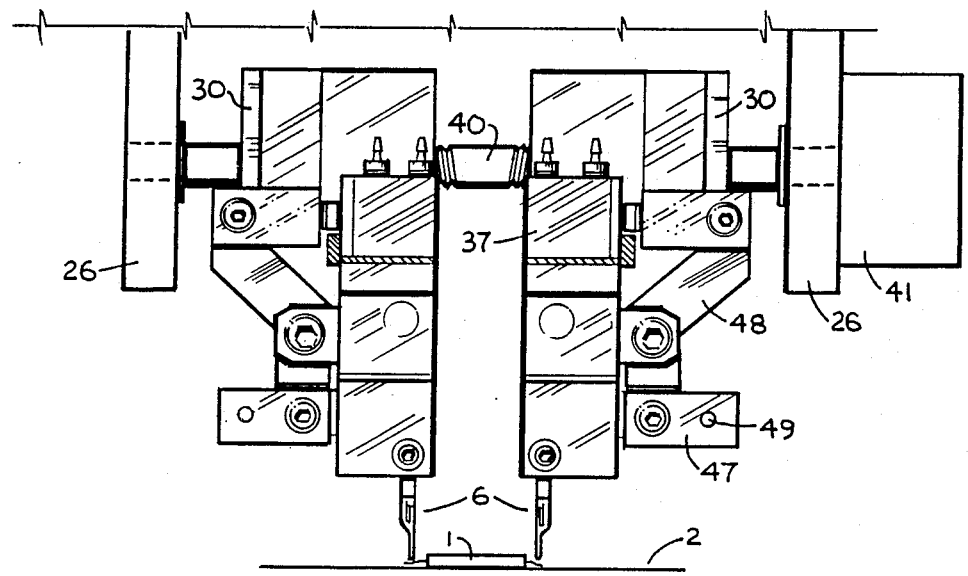
FIG. 5 is a side view, showing more of the overall structure.

In the invention, the heater bar is allowed to float or rock briefly on contacting the leads, so that it is self-aligning on the leads. It is then locked in position and the pressure and voltage to heat the heater bar are applied to reflow solder the leads.

In the preferred embodiment, the voltage is applied through the clamping means.

FIGS. 1 and 2 illustrate the principle of the invention. An electronic component 1 such as an integrated circuit is positioned on a circuit board 2 for bonding to the circuit board by reflow soldering. As seen in FIGS. 1 and 2, there are a number of leads 3 to be reflow soldered to corresponding contact points 4 on the circuit board. The leads are pre-tinned with solder 5. Typical spacing between leads is from 0.100 to 0.015 inches, and there may be many leads along one side of the component. Leads may be on one, two, three or all four sides of the component.

As in the prior art, a heater bar 6 is lowered into contact with the leads 3, pressing them lightly against the contact points 4. Heat is applied to melt and reflow the solder to effect the connection. As can be envisioned from FIG. 2, if for any reason the circuit board 2 and the bottom of the heater bar are not parallel, a situation arises where the leads near one end of the component may not be properly pressed against their contact points, while the leads near the other end of the component may be pressed too hard, possibly causing damage.

In the present invention, however, as illustrated by arrows in FIGS. 1, 2 and 3, the heater bar 6 is permitted to rock within its plane, in a manner described in greater detail below. This permits the heater bar to be positioned parallel to the circuit board in every case.

The heater bar 6, as seen most clearly in FIG. 1, has a support arm 8 projecting therefrom in the direction upwardly away from the heating element portion 9. The heater bar (including the support arm portion thereof) includes positive and negative portions 10 and 11, insulated from each other by insulating material 12, and connected to opposite sides of the V-shaped heating element portion 9. The positive and negative portions are preferably gold-plated to effect a better electrical contact. The heating element portion is typically made of Inconel (trademark).

FIG. 3 shows in greater detail how the heater bar is permitted to rock. A carriage assembly 14 includes a channel 15 which accommodates the support arm 8 and is somewhat larger in the horizontal dimension in the plane of the heater bar, thereby providing room for the heater bar to rock in its plane within the channel. The clearance which permits the rocking is not large, since there is no need to permit rocking through a large angle. The clearance should be sufficient to permit rocking through an angle of at least about four degrees on either side of the vertical, which is more than sufficient to accommodate the expected range of defects in alignment of the circuit board. This clearance is preferably provided by tapering the channel 15 so that it flares slightly outwardly from bottom to top. There is only minimal clearance in the channel in the dimension normal to the plane of the heater bar, so that the rocking is confined to the plane of the heater bar.

In order to loosely retain the support arm 8 in the channel 15, two holes 16 leading from opposite sides of the channel are provided, with a spring 17 and ball 18 in each blind hole. Detent notches 20 are provided in the support arm 8 for receiving the balls. The holes 16 may be blind holes, or preferably through holes with set screws 22 positioned therein.

Figure 6:
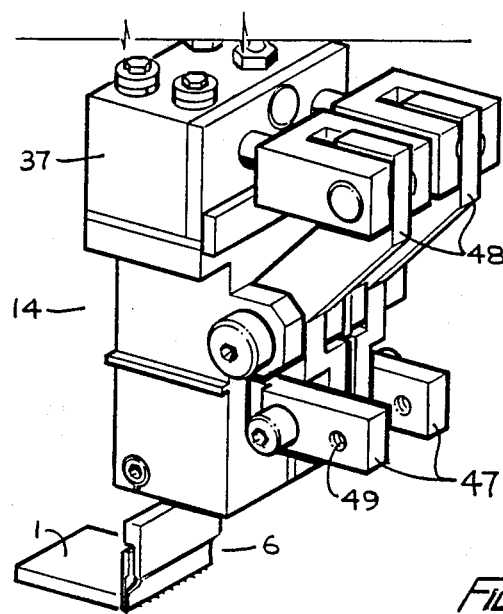
FIG. 6 is a perspective showing the structure of the preferred embodiment of the apparatus.

Referring now to FIGS. 4, 5 and 6, the overall structure and operation will be described in greater detail. First of all, a robot arm (not shown), or some other suitable mechanism, brings the entire assembly into the correct position above the circuit board. An aluminum frame 26 mounted on the end of the robot arm supports two heater bars assemblies, as seen most clearly in FIG. 5. Each heater bar assembly includes a support assembly 30 mounted to the frame. Mounted to each support assembly 30 on vertical float bearings 32 is a carriage assembly support 34 to which the carriage assembly 14 is secured. An air cylinder 35 mounted in a fixed position with respect to the support assembly 30 provides control of the movement of the carriage assembly support (and thus the carriage assembly) up and down on the vertical float bearings.

Once the robot arm has properly positioned the entire assembly above the circuit board and electronic component leads, the heater bars are positioned on the part and level on the leads under the pressure of the springs behind the balls. Because the heater bars are permitted to rock or float at this stage, they align themselves properly on the leads, i.e. parallel to the circuit board. An air cylinder 37 on each carriage is then actuated to lock the heater bar in position with respect to the carriage, in the manner described in greater detail below. The other air cylinder 35 is pressurized to provide a downward force on the heater bars. The electric power supply is then turned on, resulting in heating of the heater bar heating element, and reflow soldering occurs, attaaching the component to the circuit board. The power supply is turned off, the robot arm retracts the entire assembly, and the air cylinders are retracted.

The two support assemblies 30 are positioned to move towards and away from each other on a guide rail (not shown) at the back of the frame 26, and are mounted on a counter-threaded rod 40 rotatably mounted through the frame, as seen in FIG. 5. Rotation of the counter-threaded rod results in the two support assemblies moving towards or away from each other, depending on the direction of rotation, thereby increasing or decreasing the spacing between the two heater bars 6. This permits the spacing to be controlled to accommodate different component configurations. A servo motor 41 is connected to produce the desired rotation.

The operation of the system is preferably carried out by a programmable control system.

How the heater bar 6 is locked in its channel 15 in the carriage after proper positioning on the component leads will now be described in greater detail. As seen best in FIG. 3, the carriage has two halves 43 and 43' electrically insulated from each other by insulation 44. The halves each have a groove running upwardly from the lower portion of their interfacing surfaces to cooperatively define the channel 15. As seen in FIG. 4, leading in towards each groove at right angles thereto is a passageway 46, which accommodates a sliding clamping bar 47. A linkage arm 48 pivoting on the carriage is pivotally connected between the clamping bar and the air cylinder 37, such that actuation of the air cylinder forces the clamping bar into the passageway and against the heater bar in the channel. As seen in FIG. 6, there is such a clamping bar for each half of the carriage, each actuated by linkage arms 48 connected to the air cylinder 37. Since the support arm 8 of the heater bar has separate positive and negative sections 10 and 11 corresponding to the sections within the groove of each carriage half, the clamping bars can be used to supply power to the heating element by connecting one to the positive and the other to the negative terminals of the power supply (assuming direct current). This connection is effected by virtue of electrical terminal connections 49 near the outer end of each clamping bar.

It will be appreciated that the above description relates to the preferred embodiment by way of example only. Many obvious variations could be envisioned, and such variations are considered to be within the scope of the invention, whether or not expressly described above.

What is claimed as the invention is:

1. A method of reflow soldering a row of electrical component leads to a printed circuit board using a heater bar, comprising the steps of, firstly, moving the heater bar to a position above the location of said leads and allowing said heater bar to rock within its plane to float into proper position, and secondly, then clamping said heater bar, supplying voltage to heat said heater bar, and applying soldering pressure.

2. In apparatus for reflow soldering a row of electrical component leads to a printed circuit board, said apparatus including a heater bar positionable above said leads and means for moving said heater bar to contact said leads and press them against said printed circuit board, the improvement in which said heater bar is adapted to rock within its plane, further comprising means for clamping said heater bar to arrest rocking.

3. In apparatus for reflow soldering a row of electrical component leads to a printed circuit board, said apparatus including a heater bar positionable above said leads and means for moving said heater bar to contact said leads and press them against said printed circuit board, the improvement in which said heater bar is adapted to rock within its plane, in which said heater bar has a support arm projecting therefrom in the direction upwardly away from a heating element portion thereof, in which said apparatus includes a carriage moveably mounted on a frame, and in which said carriage includes a channel which accommodates said support arm and is somewhat larger in the horizontal dimension in the plane of said heater bar, thereby allowing said heater bar to rock in its plane in said channel, and further comprising means for loosely retaining said support arm in said channel.

4. The improvement as recited in claim 3, in which said loose retention is by virtue of two holes leading from opposite sides of said channel, a spring and ball positioned in each hole to bias said ball towards said channel, and detent notches in said support arm for receiving said balls.

5. The improvement as recited in claim 4, further comprising clamping means for clamping said heater bar within said carriage after contacting said leads and before applying soldering pressure, said soldering pressure being applied by applying a force or displacement between said carriage and said frame.

6. The improvement as recited in claim 5, in which said clamping is by virtue of a clamping bar moving into said channel in a direction generally normal to the plane of said heater bar to thereby clamp said support arm in said channel between said clamping bar and the wall of said channel.

7. The improvement as recited in claim 6, in which said support arm includes positive and negative contact portions insulated from each other and in which said clamping bar includes corresponding positive and negative contact portions insulated from each other and adapted to receive an applied voltage, said clamping resulting in respective positive and negative contact portions coming into contact with each other, thereby supplying said voltage across said heating element portion.

8. The improvement as recited in claim 7, further comprising control means for in sequence first moving said carriage to a position opposite the location of said leads and allowing said heater bar to float into proper position, and then clamping said heater bar, supplying said voltage to heat said heating element portion, and applying soldering pressure.

9. The improvement as recited in claim 6, further comprising control means for in sequence first moving said carriage to a position opposite the location of said leads and allowing said heater bar to float into proper position, and then clamping said heater bar, supplying said voltage to heat said heating element portion, and applying soldering pressure.

10. The improvement as recited in claim 5, further comprising control means for in sequence first moving said carriage to a position opposite the location of said leads and allowing said heater bar to float into proper position, and then clamping said heater bar, supplying said voltage to heat said heating element portion, and applying soldering pressure.

11. The improvement as recited in claim 4, further comprising control means for in sequence first moving said carriage to a position opposite the location of said leads and allowing said heater bar to float into proper position, and then clamping said heater bar, supplying said voltage to heat said heating element portion, and applying soldering pressure.

12. The improvement as recited in claim 3, further comprising clamping means for clamping said heater bar within said carriage after contacting said leads and before applying soldering pressure, said soldering pressure being applied by applying a force or displacement between said carriage and said frame.

13. The improvement as recited in claim 12, in which said clamping is by virtue of a clamping bar moving into said channel in a direction generally normal to the plane of said heater bar to thereby clamp said support arm in said channel between said clamping bar and the wall of said channel.

14. The improvement as recited in claim 13, in which said support arm includes positive and negative contact portions insulated from each other and in which said clamping bar includes corresponding positive and negative contact portions insulated from each other and adapted to receive an applied voltage, said clamping resulting in respective positive and negative contact portions coming into contact with each other, thereby supplying said voltage across said heating element portion.

15. The improvement as recited in claim 14, further comprising control means for in sequence first moving said carriage to a position opposite the location of said leads and allowing said heater bar to float into proper position, and then clamping said heater bar, supplying said voltage to heat said heating element portion, and applying soldering pressure.

16. The improvement as recited in claim 13, further comprising control means for in sequence first moving said carriage to a position opposite the location of said leads and allowing said heater bar to float into proper position, and then clamping said heater bar, supplying said voltage to heat said heating element portion, and applying soldering pressure.

17. The improvement as recited in claim 12, further comprising control means for in sequence first moving said carriage to a position opposite the location of said leads and allowing said heater bar to float into proper position, and then clamping said heater bar, supplying said voltage to heat said heating element portion, and applying soldering pressure.

18. The improvement as recited in claim 3, further comprising control means for in sequence first moving said carriage to a position opposite the location of said leads and allowing said heater bar to float into proper position, and then clamping said heater bar, supplying said voltage to heat said heating element portion, and applying soldering pressure.

* * * * *